US012765244B2

(12) United States Patent
Lee et al.

(10) Patent No.: US 12,765,244 B2
(45) Date of Patent: Oct. 13, 2026

(54) DISPLAY DEVICE AND METHOD FOR MANUFACTURING THE SAME

(71) Applicant: SAMSUNG DISPLAY CO., LTD., Yongin-si (KR)

(72) Inventors: Kyunghee Lee, Yongin-si (KR); Daewon Kim, Yongin-si (KR); Jongho Son, Yongin-si (KR); Hyebeom Shin, Yongin-si (KR); Jinhyeong Lee, Yongin-si (KR); Sun-Young Chang, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 443 days.

(21) Appl. No.: 18/328,880

(22) Filed: Jun. 5, 2023

(65) Prior Publication Data

US 2024/0164193 A1 May 16, 2024

(30) Foreign Application Priority Data

Oct. 28, 2022 (KR) ........................ 10-2022-0141596

(51) Int. Cl.
*H10K 59/80* (2023.01)
*H10K 59/12* (2023.01)

(52) U.S. Cl.
CPC ..... *H10K 59/8791* (2023.02); *H10K 59/1201* (2023.02); *H10K 59/873* (2023.02)

(58) Field of Classification Search
CPC ........... H10K 59/8791; H10K 59/1201; H10K 59/873; H10K 59/50; H10K 50/86; H10K 50/844; H10K 71/00
See application file for complete search history.

(56) References Cited

U.S. PATENT DOCUMENTS

2012/0249504 A1* 10/2012 Kim ........................ G06F 3/041 345/207
2016/0093833 A1* 3/2016 No ...................... H10K 59/8793 438/31
2016/0343970 A1* 11/2016 Tazaki ...................... B32B 3/08
2019/0051709 A1* 2/2019 Puszka .................... H10K 59/38
2021/0359275 A1* 11/2021 Beon .................... G02B 5/3033
2022/0209204 A1 6/2022 Kim et al.
2023/0096606 A1 3/2023 Yang

FOREIGN PATENT DOCUMENTS

KR 10-1076262 10/2011
KR 10-1778291 9/2017
KR 10-2021-0134887 A 11/2021
KR 10-2022-0097789 A 7/2022

* cited by examiner

*Primary Examiner* — Kevin Quarterman
(74) *Attorney, Agent, or Firm* — F. CHAU & ASSOCIATES, LLC

(57) ABSTRACT

A display device includes a base substrate, a light emitting element disposed on the base substrate, an inorganic layer disposed on the light emitting element and including a metal and a metal oxide layer, an encapsulation layer disposed on the inorganic layer, an organic layer disposed on the encapsulation layer and including a quarter-wave plate, and an anti-reflection layer disposed on the organic layer.

10 Claims, 10 Drawing Sheets

| Comp. | $R_1$ | $R_2$ |
|---|---|---|
| $A_1$ | $CH_2$=CH-COO-$C_6H_{12}$O- | -O$C_6H_{12}$-OOC-CH=$CH_2$ |
| $A_2$ | $CH_2$=CH-COO-$C_6H_{12}$O- | -O$C_6H_{13}$ |
| $A_3$ | $H_{13}C_6$O- | -O$C_6H_{12}$-OOC-CH=$CH_2$ |
| $B_1$ | $CH_2$=CH-COO-$C_{11}H_{22}$O- | -O$C_{11}H_{22}$-OOC-CH=$CH_2$ |
| $B_2$ | $CH_2$=CH-COO-$C_{11}H_{22}$O- | -O$C_6H_{13}$ |
| $B_3$ | $H_{13}C_6$O- | -O$C_{11}H_{22}$-OOC-CH=$CH_2$ |

| Comp. | $R_1$ | $R_2$ |
|---|---|---|
| $A_1$ | $CH_2=CH-COO-C_6H_{12}O-$ | $-OC_6H_{12}-OOC-CH=CH_2$ |
| $A_2$ | $CH_2=CH-COO-C_6H_{12}O-$ | $-OC_6H_{13}$ |
| $A_3$ | $H_{13}C_6O-$ | $-OC_6H_{12}-OOC-CH=CH_2$ |
| $B_1$ | $CH_2=CH-COO-C_{11}H_{22}O-$ | $-OC_{11}H_{22}-OOC-CH=CH_2$ |
| $B_2$ | $CH_2=CH-COO-C_{11}H_{22}O-$ | $-OC_6H_{13}$ |
| $B_3$ | $H_{13}C_6O-$ | $-OC_{11}H_{22}-OOC-CH=CH_2$ |

(a) (b) (c) (d) (e) (f) (g) (h) (i) (j) (k) (l)

DISPLAY DEVICE AND METHOD FOR MANUFACTURING THE SAME

CROSS-REFERENCE TO RELATED APPLICATION

This application claims priority under 35 U.S.C. § 119 to Korean Patent Application No. 10-2022-0141596, filed on Oct. 28, 2022, in the Korean Intellectual Property Office, the content of which is herein incorporated by reference in its entirety.

TECHNICAL FIELD

The present disclosure relates to a display device and a method for manufacturing the same, and more particularly, relates to a display device with reduced external light reflection and a method for manufacturing the same.

DISCUSSION OF RELATED ART

With the development of information technology, which is the use of computers to create, process, store, retrieve and exchange all kinds of data and information, display devices are gaining increasing importance as connection mediums between users and information. For example, the use of display devices such as liquid crystal display device ("LCD"), organic light emitting display device ("OLED"), plasma display panel device ("PDP"), quantum dot display device and the like is increasing.

The display device may display an image on a screen viewable by the users. At this time, as external light incident on the display device is reflected from the surface of the display device, the reflected light may merge into the display light output from the display device to affect the color and intensity of the display light, so that the display quality of the display device may be degraded.

SUMMARY

Embodiments of the present disclosure provide a display device with enhanced display quality.

Embodiments of the present disclosure provide a method for manufacturing the display device.

A display device according to an embodiment of the present disclosure may include a base substrate, a light emitting element disposed on the base substrate, an inorganic layer including a metal and a metal oxide layer disposed on the light emitting element, an encapsulation layer disposed on the inorganic layer, an organic layer including a quarter-wave plate disposed on the encapsulation layer and an anti-reflection layer disposed on the organic layer.

In an embodiment of the present disclosure, the organic layer may include a material having negative dispersion.

In an embodiment of the present disclosure, the material having negative dispersion may include a reactive mesogen liquid crystal.

In an embodiment of the present disclosure, the metal may include at least one selected from a group including ytterbium (Yb), bismuth (Bi), tin (Sn), zinc (Zn) and indium (In).

In an embodiment of the present disclosure, the metal oxide layer may include at least one selected from a group including molybdenum dioxide ($MoO_2$), molybdenum trioxide ($MoO_3$), tungsten trioxide ($WO_3$), indium tin oxide (ITO) and zinc oxide (ZnO).

In an embodiment of the present disclosure, the anti-reflection layer may include a reactive mesogen liquid crystal and a dichroic dye.

In an embodiment of the present disclosure, the reactive mesogen liquid crystal may have a nematic phase.

In an embodiment of the present disclosure, the reactive mesogen liquid crystal may have a smectic A phase.

In an embodiment of the present disclosure, the dichroic dye may include an azo group.

In an embodiment of the present disclosure, a mass ratio of a mass of the dichroic dye to a total mass of the reactive mesogen liquid crystal may be about 10% or less.

A method for manufacturing a display device according to an embodiment of the present disclosure may include forming a light emitting element on a base substrate, forming an inorganic layer including a metal and a metal oxide layer on the light emitting element, forming an encapsulation layer on the inorganic layer, forming an organic layer including a quarter-wave plate on the encapsulation layer and forming an anti-reflection layer on the organic layer.

In an embodiment of the present disclosure, the organic layer may include a material having negative dispersion.

In an embodiment of the present disclosure, the material having negative dispersion may include a reactive mesogen liquid crystal.

In an embodiment of the present disclosure, the metal may include at least one selected from a group including ytterbium (Yb), bismuth (Bi), tin (Sn), zinc (Zn) and indium (In) and the metal oxide layer may include at least one selected from a group including molybdenum dioxide ($MoO_2$), molybdenum trioxide ($MoO_3$), tungsten trioxide ($WO_3$), indium tin oxide (ITO) and zinc oxide (ZnO).

In an embodiment of the present disclosure, the anti-reflection layer may include a reactive mesogen liquid crystal and a dichroic dye.

In an embodiment of the present disclosure, the forming of the anti-reflection layer may include doping and coating the reactive mesogen liquid crystal with the dichroic dye.

In an embodiment of the present disclosure, the reactive mesogen liquid crystal may have a nematic phase.

In an embodiment of the present disclosure, the reactive mesogen liquid crystal may have a smectic A phase.

In an embodiment of the present disclosure, the dichroic dye may include an azo group.

In an embodiment of the present disclosure, a mass ratio of a mass of the dichroic dye to a total mass of the reactive mesogen liquid crystal may be about 10% or less.

BRIEF DESCRIPTION OF THE DRAWINGS

Illustrative, non-limiting embodiments of the present disclosure will be more clearly understood from the following detailed description in conjunction with the accompanying drawings, in which.

Figure 1:
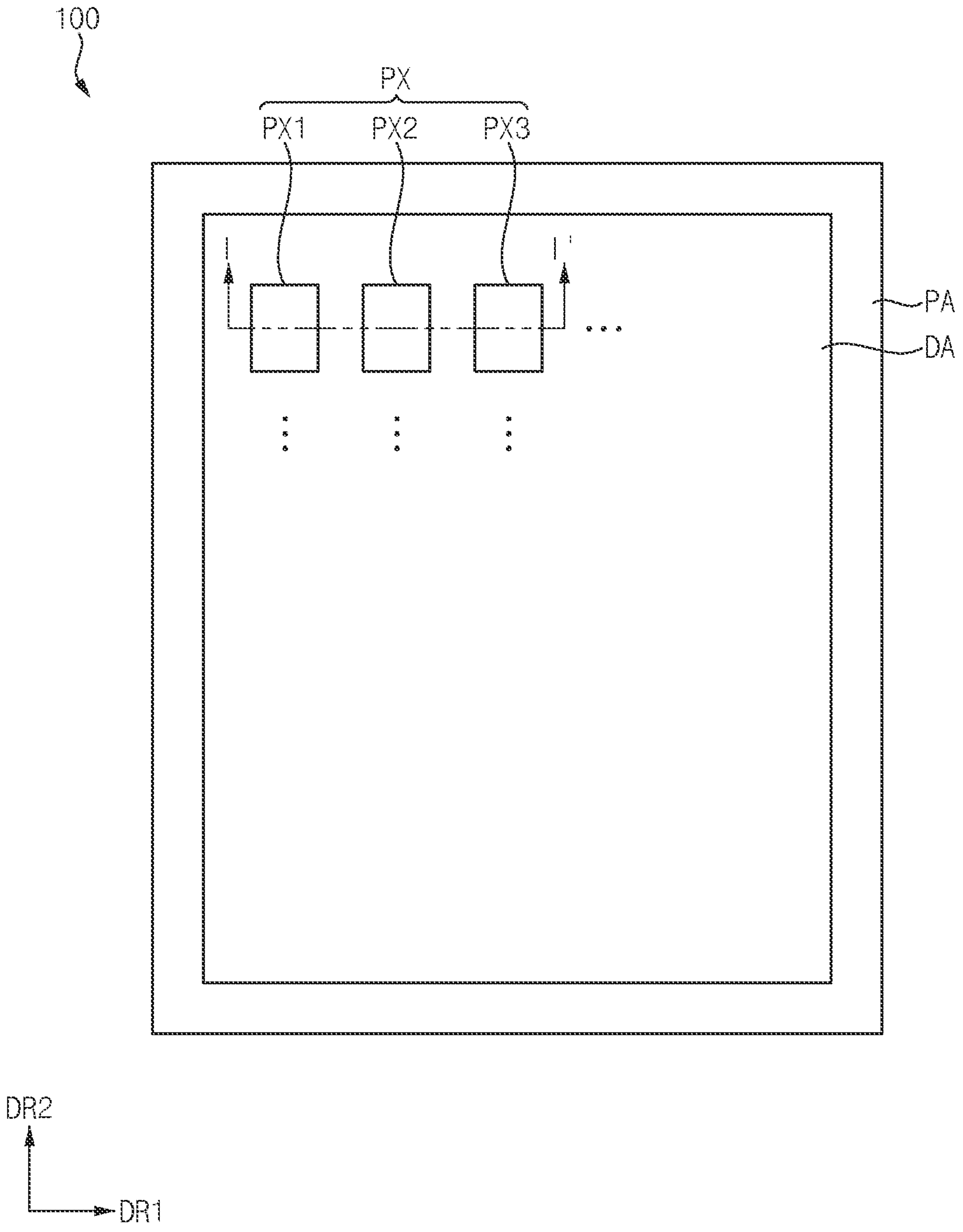
FIG. 1 is a plan view illustrating a display device according to an embodiment of the present disclosure.

Since the drawings in FIGS. 1-11 are intended for illustrative purposes, the elements in the drawings are not necessarily drawn to scale. For example, some of the elements may be enlarged or exaggerated for clarity purpose.

DETAILED DESCRIPTION OF THE EMBODIMENTS

Hereinafter, embodiments of the present disclosure will be described in detail with reference to the accompanying drawings. The same reference numerals are used for the same components in the drawings, and redundant descriptions of the same components will be omitted.

FIG. 1 is a plan view illustrating a display device according to an embodiment of the present disclosure.

Referring to FIG. 1, a display device 100 according to an embodiment of the present disclosure may include a display area DA and a peripheral area PA. The display area DA may be defined as an area displaying an image. The peripheral area PA may be defined as an area that does not display an image. The peripheral area PA may be disposed around the display area DA. For example, the peripheral area PA may entirely surround the display area DA.

The display area DA may include a plurality of pixel areas PX. Each of the pixel areas PX may include a first pixel area PX1, a second pixel area PX2, and a third pixel area PX3. The peripheral area PA may be non-display areas where pixel areas PX are not located.

Each of the first pixel area PX1, the second pixel area PX2, and the third pixel area PX3 may be defined as an area in which light emitted from a light emitting element is emitted to the outside of the display device 100. For example, the first pixel area PX1 may emit a first light, the second pixel area PX2 may emit a second light, and the third pixel area PX3 may emit a third light. In an embodiment of the present disclosure, the first light may be red light, the second light may be green light, and the third light may be blue light. However, the present disclosure is not limited thereto. For example, the pixel areas PX may include areas from which yellow, cyan, and magenta lights are emitted.

The pixel areas PX may emit light of four or more colors. For example, the pixel areas PX may include areas from which red light, green light, blue light, and at least one of yellow, cyan, and magenta lights are emitted. In addition, the pixel areas PX may further include an area from which white light is emitted. For example, the pixel areas PX may emit white light and/or colored light.

In the present specification, a plane may be defined by a first direction DR1 and a second direction DR2 crossing the first direction DR1. For example, the first direction DR1 and the second direction DR2 may be perpendicular to each other.

In a plan view, each of the first pixel area PX1, the second pixel area PX2, and the third pixel area PX3 may be repeatedly arranged in a row direction and a column direction. For example, each of the first pixel area PX1, the second pixel area PX2, and the third pixel area PX3 may be repeatedly arranged in the first direction DR1 and the second direction DR2 in a plan view. In an embodiment of the present disclosure, the first pixel area PX1, the second pixel area PX2, and the third pixel area PX3 may be arranged in a matrix shape, but the present disclosure is not limited thereto. For example, the first pixel area PX1, the second pixel area PX2, and the third pixel area PX3 may be arranged in a pentile matrix shape, or a diamond shape.

Each of the first pixel area PX1, the second pixel area PX2, and the third pixel area PX3 may have, for example, a triangular planar shape, a rectangular planar shape, a circular planar shape, a track-type planar shape, an elliptical planar shape, or the like. In an embodiment of the present disclosure, each of the first pixel area PX1, the second pixel area PX2, and the third pixel area PX3 may have a rectangular planar shape. However, the present disclosure is not limited thereto, and each of the first pixel area PX1, the second pixel area PX2, and the third pixel area PX3 may have a different planar shape. For example, each of the first pixel area PX1, the second pixel area PX2, and the third pixel area PX3 may have a different size and/or a different shape, or may have the same size and/or the same shape.

Figure 2:
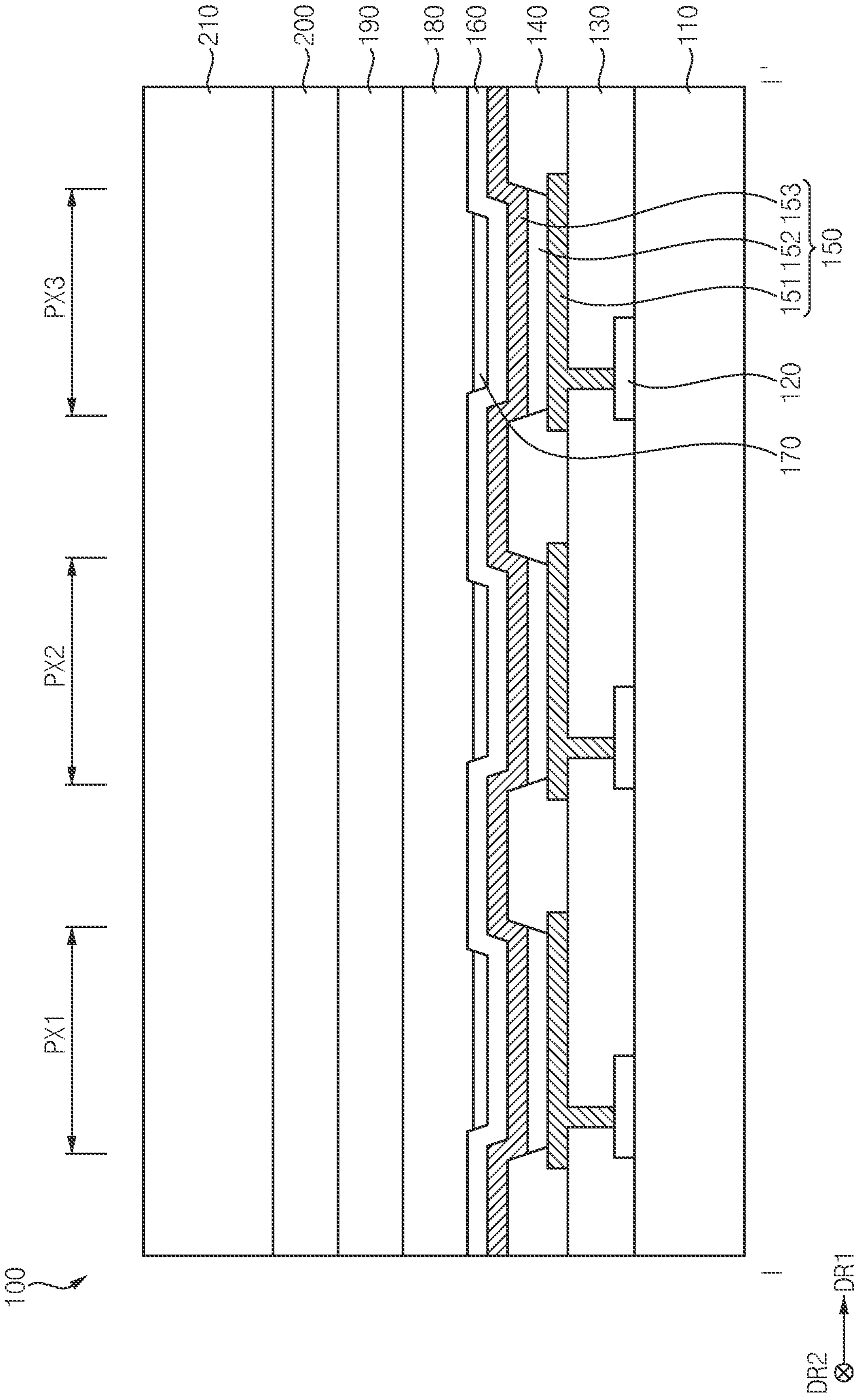
FIG. 2 is a cross-sectional view taken along line I-I' of FIG. 1.
Figure 3:
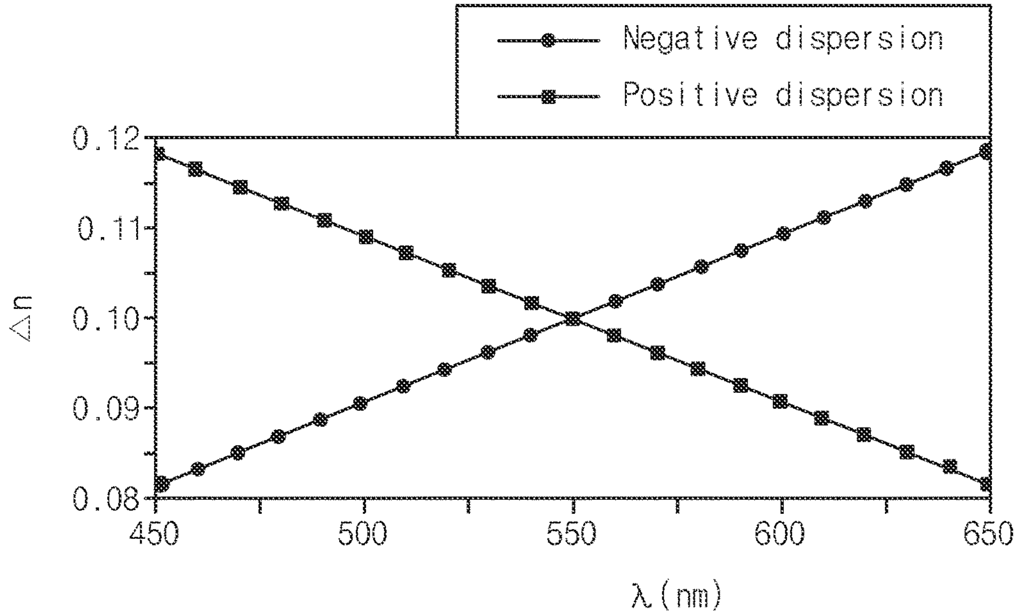
FIGS. 3 and 4 are diagrams for explaining an organic layer having negative dispersion.
Figure 4:
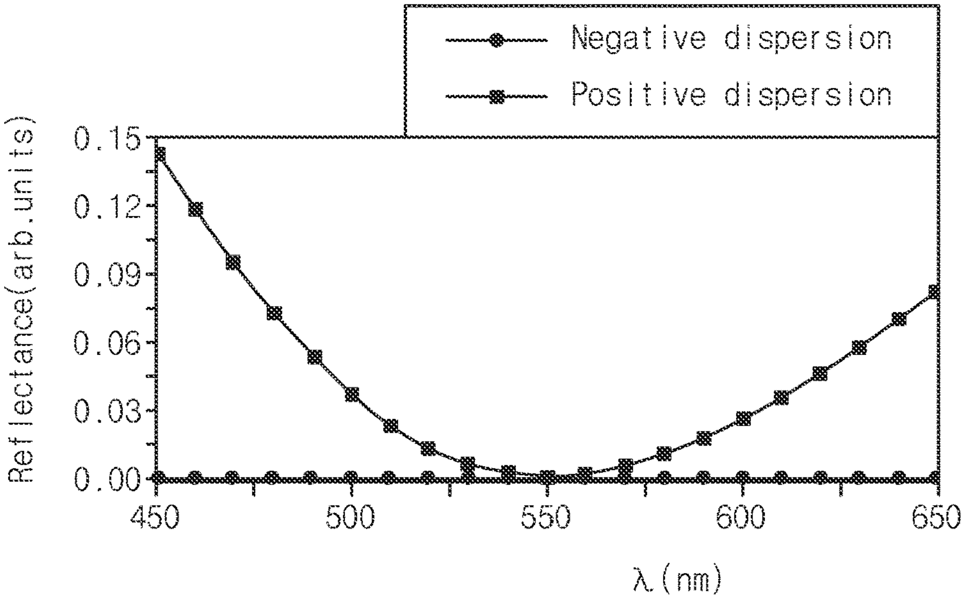

FIG. 2 is a cross-sectional view taken along line I-I' of FIG. 1. FIGS. 3 and 4 are diagrams for explaining an organic layer having negative dispersion.

Referring to FIGS. 2, 3 and 4, the display device 100 according to an embodiment of the present disclosure may include a base substrate 110, a transistor 120, an insulating structure 130, a pixel defining layer 140, a light emitting element 150, a capping layer 160, an inorganic layer 170, an encapsulation layer 180, a sensing layer 190, an organic layer 200 and an anti-reflection layer 210. Here, the light emitting element 150 may include a lower electrode 151, an organic light emitting layer 152 and an upper electrode 153.

The base substrate 110 may include a transparent material or an opaque material. For example, the base substrate 110 may include a transparent resin substrate. A polyimide substrate is mentioned as an example of the said transparent resin substrate. In this case, the polyimide substrate may include, for example, a first organic layer, a first barrier layer, a second organic layer, etc. Alternatively, the base substrate 110 may include, for example, a quartz substrate, a synthetic quartz substrate, a calcium fluoride substrate, a fluorine-doped quartz substrate, a soda-lime substrate, a non-alkali glass substrate, etc. These may be used alone or in combination with each other. According to an embodiment of the present disclosure, the base substrate 110 may include a flexible material. The flexible material may refer to a substrate that is flexible, and is easily bendable, foldable, or rollable. The base substrate 110 including such a flexible material may include, for example, ultrathin type glass, or plastic.

The transistor 120 may be disposed on the base substrate 110. For example, the transistor 120 may include, for example, amorphous silicon (a-Si), polycrystalline silicon (pc-Si), or a metal oxide semiconductor.

The metal oxide semiconductor may include, for example, a binary compound ($AB_x$), a ternary compound ($AB_xC_y$), a quaternary compound ($AB_xC_yD_z$), etc. In this case, the metal of the metal oxide semiconductor may include, for example, indium (In), zinc (Zn), gallium (Ga), tin (Sn), titanium (Ti), aluminum (Al), hafnium (Hf), zirconium (Zr), magnesium (Mg), etc. For example, the metal oxide semiconductor may include, for example, zinc oxide (ZnO), gallium oxide ($GaO_x$), tin oxide ($SnO_x$), indium oxide ($InO_x$), indium gallium oxide (IGO), indium zinc oxide (IZO), and indium tin oxide (ITO), aluminum zinc oxide (AZO), indium zinc tin oxide (IZTO), indium gallium zinc oxide (IGZO), etc. These may be used alone or in combination with each other.

The insulating structure 130 may be disposed on the base substrate 110. The insulating structure 130 may cover the transistor 120. The insulating structure 130 may include at least one inorganic insulating layer and at least one organic insulating layer. For example, the inorganic insulating layer may include, for example, silicon oxide ($SiO_x$), silicon nitride ($SiN_x$), silicon carbide ($SiC_x$), silicon oxynitride ($SiO_xN_y$), silicon oxycarbide ($SiO_xC_y$), etc. In addition, the organic insulating layer may include, for example, a photoresist, a polyacryl-based resin, a polyimide-based resin, a polyamide-based resin, a siloxane-based resin, an acrylic resin, an epoxy-based resin, etc. These may be used alone or in combination with each other.

The lower electrode 151 may be disposed in each of the first, second, and third pixel areas PX1, PX2, and PX3 on the insulating structure 130. The lower electrode 151 may be connected to the transistor 120 through a contact hole formed by removing a portion of the insulating structure 130. For example, the lower electrode 151 may be a (semi-) transmissive electrode or a reflective electrode, and may include, for example, a metal, an alloy, a metal nitride, a conductive metal oxide, a transparent conductive material, etc. These may be used alone or in combination with each other. In an embodiment of the present disclosure, the lower electrode 151 may include a conductive metal oxide such as, for example, indium tin oxide (ITO), indium zinc oxide (IZO), zinc oxide (ZnO), indium oxide ($InO_x$), indium gallium oxide (IGO), aluminum zinc oxide (AZO), or a combination thereof. In an embodiment of the present disclosure, the lower electrode 151 may include a reflective film including, for example, silver (Ag), magnesium (Mg), aluminum (Al), platinum (Pt), palladium (Pd), gold (Au), nickel (Ni), neodymium (Nd), iridium (Ir), chromium (Cr), or a compound thereof. In an embodiment of the present disclosure, the lower electrode 151 may further include a film formed of, for example, ITO, IZO, ZnO, or $InO_x$ over/under the reflective film. In an embodiment of the present disclosure, the lower electrode 151 may be referred to as an anode electrode.

The pixel defining layer 140 may be disposed on the insulating structure 130 and the lower electrode 151. The pixel defining layer 140 may cover both sides (peripheral portions) of the lower electrode 151 and expose an upper surface of the lower electrode 151. The pixel defining layer 140 may prevent generation of arc, and the like between the lower electrode 151 and the upper electrode 153 at the edge of the lower electrode 151, by increasing a distance between the edge of the lower electrode 151 and the upper electrode 153 above the lower electrode 151. The pixel defining layer 140 may include an organic material and/or an inorganic material. In an embodiment of the present disclosure, the pixel defining layer 140 may include an organic material. For example, the pixel defining layer 140 may include, for example, a photoresist, a polyacrylic resin, a polyimide-based resin, a polyamide-based resin, a siloxane-based resin, an acrylic resin, an epoxy-based resin, etc. These may be used alone or in combination with each other.

The organic light emitting layer 152 may be disposed in each of the first, second, and third pixel areas PX1, PX2, and PX3 on the lower electrode 151. For example, holes provided from the lower electrode 151 and electrons provided from the upper electrode 153 combine in the organic light emitting layer 152 to form excitons, and as the excitons change from an excited state to a ground state, the organic light emitting layer 152 may emit light.

The organic light emitting layer 152 may emit light having a specific color (e.g., red, green and/or blue). In an embodiment of the present disclosure, the organic light emitting layer 152 may include one or both of an organic light emitting material and a quantum dot. For example, the organic light emitting layer 152 may include an organic material including a fluorescent or phosphorescent material that emits red, green, blue, or white light. The quantum dot is a particle having a crystal structure of several to tens of nanometers in size, and may include hundreds to thousands of atoms. The quantum dot may include a fluorescent material or a phosphorescent material, and may produce monochromatic red, green, and blue light. In an embodiment of the present disclosure, the organic light emitting layer 152 disposed in the first pixel area PX1 may emit a first light, and the organic light emitting layer 152 disposed in the second pixel area PX2 may emit a second light, and the organic light emitting layer 152 disposed in the third pixel area PX3 may emit a third light. For example, the first light may be red light, the second light may be green light and the third light may be blue light. However, the present disclosure is not limited thereto. For example, the organic light emitting layers 152 in the pixel areas PX may emit yellow, cyan, and magenta lights. In addition, the pixel areas PX may further include an area, in which the organic light emitting layer 152 may emit white light.

The upper electrode 153 may be disposed on the organic light emitting layer 152 and the pixel defining layer 140. For example, the upper electrode 153 may include, for example, a metal, an alloy, a metal nitride, a conductive metal oxide, a transparent conductive material, etc. These may be used alone or in combination with each other. For example, the upper electrode 153 may include, for example, aluminum (Al), platinum (Pt), silver (Ag), magnesium (Mg), gold (Au), chromium (Cr), tungsten (W), titanium (Ti), and/or the like. For example, the upper electrode 153 may include a transparent conductive oxide (TCO) film such as, for example, an indium tin oxide (ITO) film, an indium zinc oxide (IZO) film, a zinc oxide (ZnO) film, or an indium oxide ($InO_x$) film. For example, the upper electrode 153 may act as a cathode.

Accordingly, the light emitting element 150 including the lower electrode 151, the organic light emitting layer 152, and the upper electrode 153 may be disposed on the base substrate 110. The light emitting element 150 may be disposed in each of the first pixel area PX1, the second pixel area PX2 and the third pixel area PX3. The light emitting element 150 may be electrically connected to the transistor 120.

The capping layer 160 may be disposed on the upper electrode 153. The capping layer 160 may be entirely disposed on the upper electrode 153. The capping layer 160 may function to protect the upper electrode 153. For example, the capping layer 160 may include an organic material and/or an inorganic material. In an embodiment of the present disclosure, the capping layer 160 may include lithium fluoride (LiF) and may be formed by thermal evaporation, but the present disclosure is not limited thereto.

The inorganic layer 170 may be disposed in each of the first, second, and third pixel areas PX1, PX2, and PX3 on the capping layer 160. The inorganic layer 170 is a light absorption layer. Light may be incident from the outside of the display device. And then, the light from the outside may be reflected from the surface of the inorganic layer 170, or may be reflected from the surface of the upper electrode 153, etc. In this case, the light reflected from the surface of the inorganic layer 170 and the light reflected from the surface of the upper electrode 153 may destructively interfere. In an embodiment of the present disclosure, the inorganic layer 170 may include a metal and a metal oxide layer. For example, the metal may include, for example, ytterbium (Yb), bismuth (Bi), tin (Sn), zinc (Zn), indium (In), etc. These may be used alone or in combination with each other. For example, the metal oxide layer may include, for example, molybdenum dioxide ($MoO_2$), molybdenum trioxide ($MoO_3$), tungsten trioxide ($WO_3$), indium tin oxide (ITO), zinc oxide (ZnO), etc. These may be used alone or in combination with each other. In an embodiment of the present disclosure, the capping layer 160 may be interposed between the inorganic layer 170 and the upper electrode 153, and may cover bottom surface and side surfaces of the inorganic layer 170. The inorganic layer 170 may vertically overlap the organic light emitting layer 152. The inorganic layer 170 disposed in the second pixel area PX2 may be separated from the inorganic layer 170 disposed in the first pixel area PX1 and the inorganic layer 170 disposed in the third pixel area PX3. In other embodiment of the present disclosure, the inorganic layer 170 may be disposed to continuously extend on the capping layer 160.

The encapsulation layer 180 may be disposed on the capping layer 160 and the inorganic layer 170. The encapsulation layer 180 may prevent impurities, moisture and the like from penetrating into the light emitting element 150 from an outside. For example, the encapsulation layer 180 may seal the display area DA to protect the light emitting element 150 from external impurities. The encapsulation layer 180 may include at least one inorganic encapsulation layer and at least one organic encapsulation layer. In an embodiment of the present disclosure, the encapsulation layer 180 may include first and second inorganic encapsulation layers and an organic encapsulation layer located between the first and second inorganic encapsulation layers. In an embodiment of the present disclosure, the number of organic encapsulation layers and the number of inorganic encapsulation layers and an order of stacking organic encapsulation layers and inorganic encapsulation layers may be variously changed. In an embodiment of the present disclosure, the inorganic encapsulation layer may include, for example, silicon oxide ($SiO_x$), silicon nitride ($SiN_x$), silicon oxynitride ($SiO_xN_y$), etc., and the organic encapsulation layer may include a cured polymer such as, for example, polyacrylate.

The sensing layer 190 may be disposed on the encapsulation layer 180. A plurality of sensing electrodes may be formed in the sensing layer 190 and may sense touch input of the user. For example, the sensing layer 190 may obtain coordinate information according to an external input, for example, a touch event. The sensing layer 190 may include sensing electrodes (or touch electrodes) and trace lines connected to each of the sensing electrodes. The sensing layer 190 may detect an external input by using a mutual capacitance method and/or a self-capacitance method. For example, the sensing layer 190 may obtain information on the external input through a change in capacitance between two sensing electrodes.

The organic layer 200 may be disposed on the sensing layer 190. When light is incident on a medium having optical anisotropy, the light is divided into two lights having different polarization and phase, and this phenomenon is called birefringence. One of the two lights propagates with an extraordinary refractive index ($n_e$) of the medium, and is referred to as an extraordinary wave ("e-wave"). The other one of the two lights propagates with an ordinary refractive index ($n_o$) of the medium, and is referred to as an ordinary wave ("o-wave"). When a thickness of the medium is d and a wavelength of the incident light is λ, the extraordinary wave and the ordinary wave may have a phase difference after passing through the medium. The phase difference can be expressed as $\Gamma=2\pi(n_e-n_o)d/\lambda$. The polarization of the incident light can be changed by adjusting the birefringence of the medium ($\Delta n=n_e-n_o$) and the thickness of the medium (d).

In an embodiment of the present disclosure, the organic layer 200 may include a quarter-wave plate. For example, the quarter-wave plate may include, for example, a uniaxially stretched cycloolefin film, a uniaxially stretched polyethylene terephthalate film, a uniaxially stretched polycarbonate film or a liquid crystal film. The quarter-wave plate may convert linearly polarized light into circularly polarized light or circularly polarized light into linearly polarized light. The quarter-wave plate may retard the velocity of one of the polarization components one-quarter of a wave out of phase from the other polarization component. For example, the quarter-wave plate may operate by introducing a relative phase shift of 90 degrees between the orthogonal wavefronts (ordinary and extraordinary) passing through when the plate is illuminated with linearly polarized light. A phase shift of 90 degrees between the ordinary and extraordinary components converts the incident linear polarized light vibrations into either elliptical or circularly polarized light.

In an embodiment of the present disclosure, the organic layer 200 may include a material having negative dispersion. For example, the material having negative dispersion may include a reactive mesogen liquid crystal. The reactive mesogen liquid crystal will be described later with reference to FIG. 5. The reactive mesogen liquid crystal may be a low molecular weight liquid crystal that can be cured (e.g., UV cured) into the network structures of a thin film.

As shown in FIG. 3, positive dispersion may be defined as a characteristic in which the birefringence of the medium (Δn) decreases as the wavelength of light at least in the visible region increases. Negative dispersion may be defined as a characteristic in which the birefringence of the medium (Δn) increases as the wavelength of light at least in the visible region increases.

As shown in FIG. 4, in the case of the organic layer 200 using the material having positive dispersion, the phase difference between the extraordinary wave and the ordinary wave ($\Gamma=2\pi(n_e-n_o)d/\lambda$) is different depending on the wavelength range. Therefore, the external light reflectance reduction effect may be limited depending on the wavelength. For example, when the organic layer 200 uses a material having positive dispersion, the light reflectance may decrease from about 450 nm to about 550 nm, and may increase from about 550 nm to about 650 nm. In contrast, in the case of the organic layer 200 using material having negative dispersion, since the phase difference between the extraordinary wave and the ordinary wave (F) is constant regardless of the wavelength range, the external light reflectance reduction effect may be exhibited for all wavelengths of light at least in the visible light range. For example, constantly low light reflectance (e.g., close to zero) may be maintained through all wavelengths of light in the visible light range, when the organic layer 200 uses a material having negative dispersion.

In an embodiment of the present disclosure, since the wavelength of the blue light (e.g., about 450 nm) and the wavelength of the red light (e.g., about 650 nm) are about 0.818 times and about 1.181 times the wavelength of the green light (e.g., about 550 nm) respectively, the organic layer 200 may preferably include a material having negative dispersion having values of Δn(450 nm)/Δn(550 nm)=0.818 and Δn(650 nm)/Δn(550 nm)=1.181.

When the term "about" is used in this specification in connection with a numerical value, it is intended that the associated numerical value includes a tolerance of up to ±10% around the stated numerical value.

The anti-reflection layer 210 may be disposed on the organic layer 200. The anti-reflection layer 210 may polarize external light incident from the outside of the display device 100. For example, the anti-reflection layer 210 may linearly polarize the external light in a direction parallel to a transmission axis of the anti-reflection layer 210. For example, the anti-reflection layer 210 may transmit the external light parallel with the transmission axis, but not the external light not parallel with the transmission axis. In other words, the external light not parallel with the transmission axis of the anti-reflection layer 210 may be blocked by the anti-reflection layer 210. For example, if the anti-reflection layer 210 has the transmission axis in parallel with a vertical direction perpendicular to the first and second directions DR1 and DR2, the light may be converted into a linearly polarized light transmitting in the vertical direction through the anti-reflection layer 210. In addition, the anti-reflection layer 210 may block the external light reflected inside the display device 100 to prevent the external light from being recognized by the user of the display device 100.

To this end, preferably, the anti-reflection layer 210 may have relatively excellent polarization characteristics. For example, the anti-reflection layer 210 may include a material having excellent alignment. For example, the anti-reflection layer 210 may include a material having a smectic B phase. However, the material having the smectic B phase has disadvantages in that it is difficult to prepare and it is difficult to induce alignment. For example, although a liquid crystal having a smectic B phase with a high degree of alignment of liquid crystal molecules may provide excellent polarization characteristics for the anti-reflection layer 210, the material having the smectic B phase is limited and difficult to induce alignment.

In the present disclosure, the anti-reflection layer 210 may include a material having a nematic phase, preferably a smectic A phase. In the smectic A phase, the director is perpendicular to the smectic plane, and there is no particular positional order in the layer, and the nematic liquid crystal phase is characterized by molecules that have no positional order but tend to point in the same direction (along the director). The material having the smectic A phase or the nematic phase may include liquid crystal molecules aligned in a certain direction, but the degree of alignment of the liquid crystal molecules included in the material having the smectic A phase or the nematic phase may be relatively low compared to the degree of alignment of the liquid crystal molecules included in the material having the smectic B phase. Accordingly, compared to the anti-reflection layer 210 including the material having the smectic B phase, the transmission axis of the anti-reflection layer 210 including the material having the smectic A phase or the nematic phase may have a relatively low degree of alignment.

To compensate for this, in the present disclosure, the organic layer 200 may be disposed under the anti-reflection layer 210. As described above, the organic layer 200 may change the polarization of the external light passing through the organic layer 200, and thus, even when the transmission axis of the anti-reflection layer 210 has a relatively low degree of alignment, the external light transmitted through the organic layer 200 may be absorbed by the anti-reflection layer 210. For example, the organic layer 200 may change the polarization of the external light to a direction not in parallel with the transmission axis of the anti-reflection layer 210.

As described above, the external light incident from the outside of the display device 100 may pass through the anti-reflection layer 210 and be polarized. And then, the external light may pass through the organic layer 200 and the polarization of the external light is changed. For example, the organic layer 200 may convert the linearly polarized light into a circularly polarized light. And then, the polarization state is reversed by being reflected from the upper electrode 153. And then, after passing through the organic layer 200 again and changing the polarization of the external light, for example, changing from the circularly polarized light into a linearly polarized light, the external light may be incident on the anti-reflection layer 210. In this case, the polarization direction of the external light may not be parallel to the transmission axis of the anti-reflection layer 210, and thus the external light may be blocked by the anti-reflection layer 210.

In an embodiment of the present disclosure, the anti-reflection layer 210 may include the reactive mesogen liquid crystal and a dichroic dye. The dichroic dye may be an organic molecule that has a rodlike shape and displays a unique anisotropy in which its light absorption properties occur parallel and perpendicular to the molecule, this being characterized by the dichroic ratio. In this case, the reactive mesogen liquid crystal may have the smectic A phase or the nematic phase. The dichroic dye may align along the alignment of the reactive mesogen liquid crystal having the smectic A phase or the nematic phase. Accordingly, the anti-reflection layer 210 may have polarization characteristics by the dichroic dye.

Although the display device 100 of the present disclosure is described by limiting an organic light emitting display device (OLED), the present disclosure is not limited thereto. In an embodiment of the present disclosure, the display device 100 may include, for example, a liquid crystal display device (LCD), a field emission display device (FED), a plasma display device (PDP), an electrophoretic display device (EPD), an inorganic light emitting display device (ILED), or a quantum dot display device.

Figure 5:
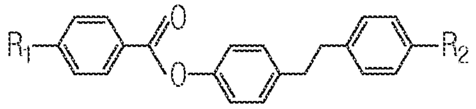
FIG. 5 is a diagram for explaining a reactive mesogen liquid crystal.
Figure 6:
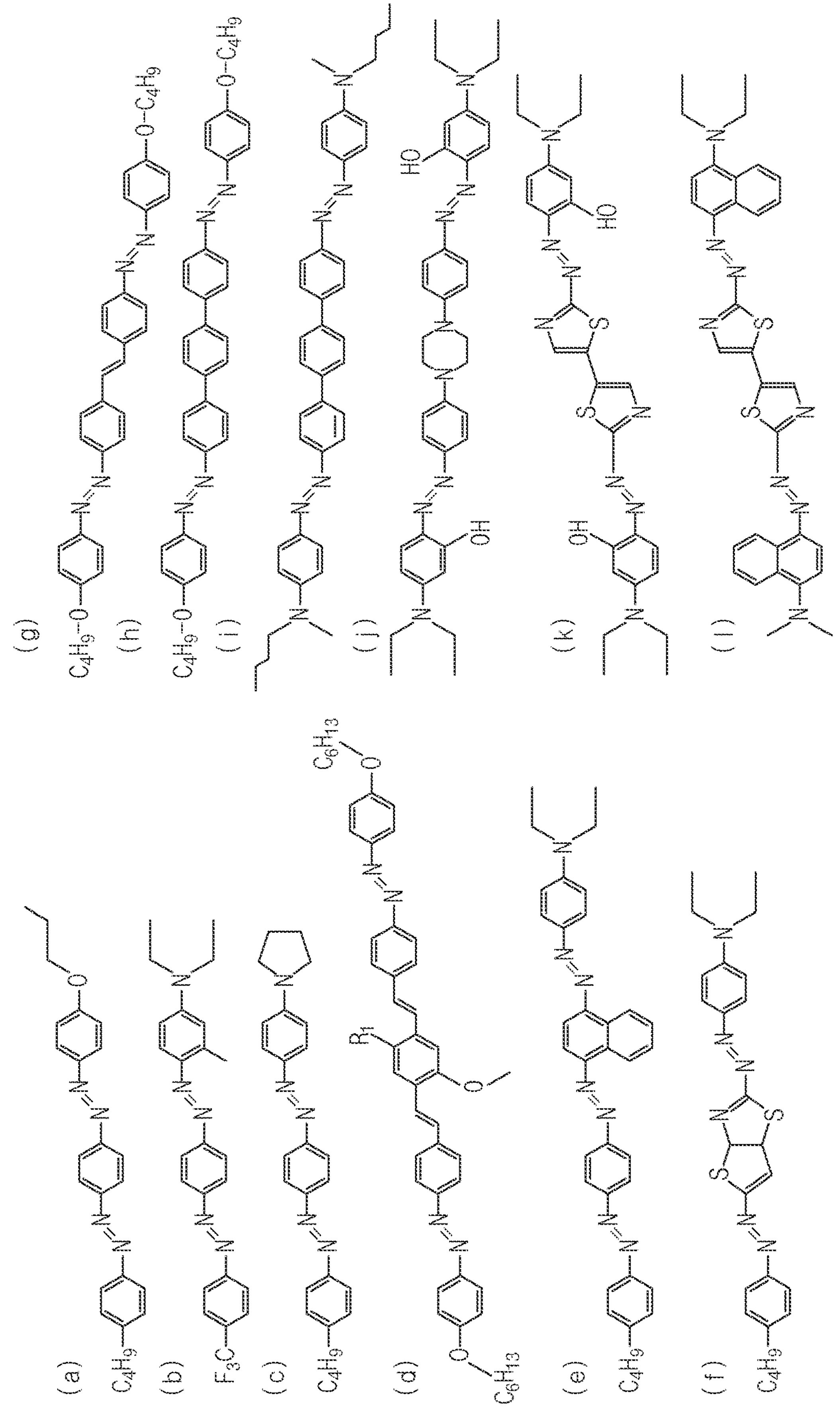
FIG. 6 is a diagram for explaining a dichroic dye.

FIG. 5 is a diagram for explaining a reactive mesogen liquid crystal. FIG. 6 is a diagram for explaining a dichroic dye.

Referring to FIG. 5, the reactive mesogen liquid crystal may include a compound represented by chemical formula 1 below.

[chemical formula 1]

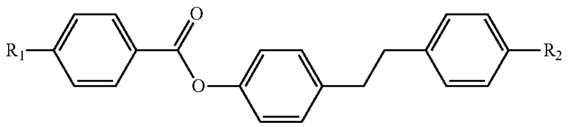

In this case, functional groups R1 and R2 may have a configuration (Comp.) of $A_1$, $A_2$, $A_3$, $B_1$, $B_2$ or $B_3$ in FIG. 5.

In an embodiment of the present disclosure, the mass ratio of the mass of the dichroic dye to the total mass of the reactive mesogen liquid crystal may be about 10% or less. When the mass ratio of the mass of the dichroic dye to the total mass of the reactive mesogen liquid crystal exceeds about 10%, the dichroic dye may not be completely dissolved in the reactive mesogen liquid crystal. In addition, when the mass ratio exceeds about 10%, the degree of alignment of the reactive mesogen liquid crystal may be relatively low.

Referring to FIG. 6, in an embodiment of the present disclosure, the dichroic dye may include an azo group (—N═N—). For example, the dichroic dye may include aromatic compounds having the azo group (—N═N—) as shown in (a) to (l) of FIG. 6. In an embodiment of the present disclosure, the anti-reflection layer 210 may further include a dye having chromophore in addition to the dichroic dye including the azo group. The color and intensity of the dichroic dye may be affected by adding the dye having chromophore. The dye having chromophore may absorb light in the visible light range, for example, light having a wavelength between about 380 nm and about 700 nm. The dichroic dye may include two or more azo groups to form a polyazole dye.

FIGS. 7, 8, 9, 10 and 11 are cross-sectional views illustrating a method of manufacturing the display device of FIG. 2.

Figure 7:
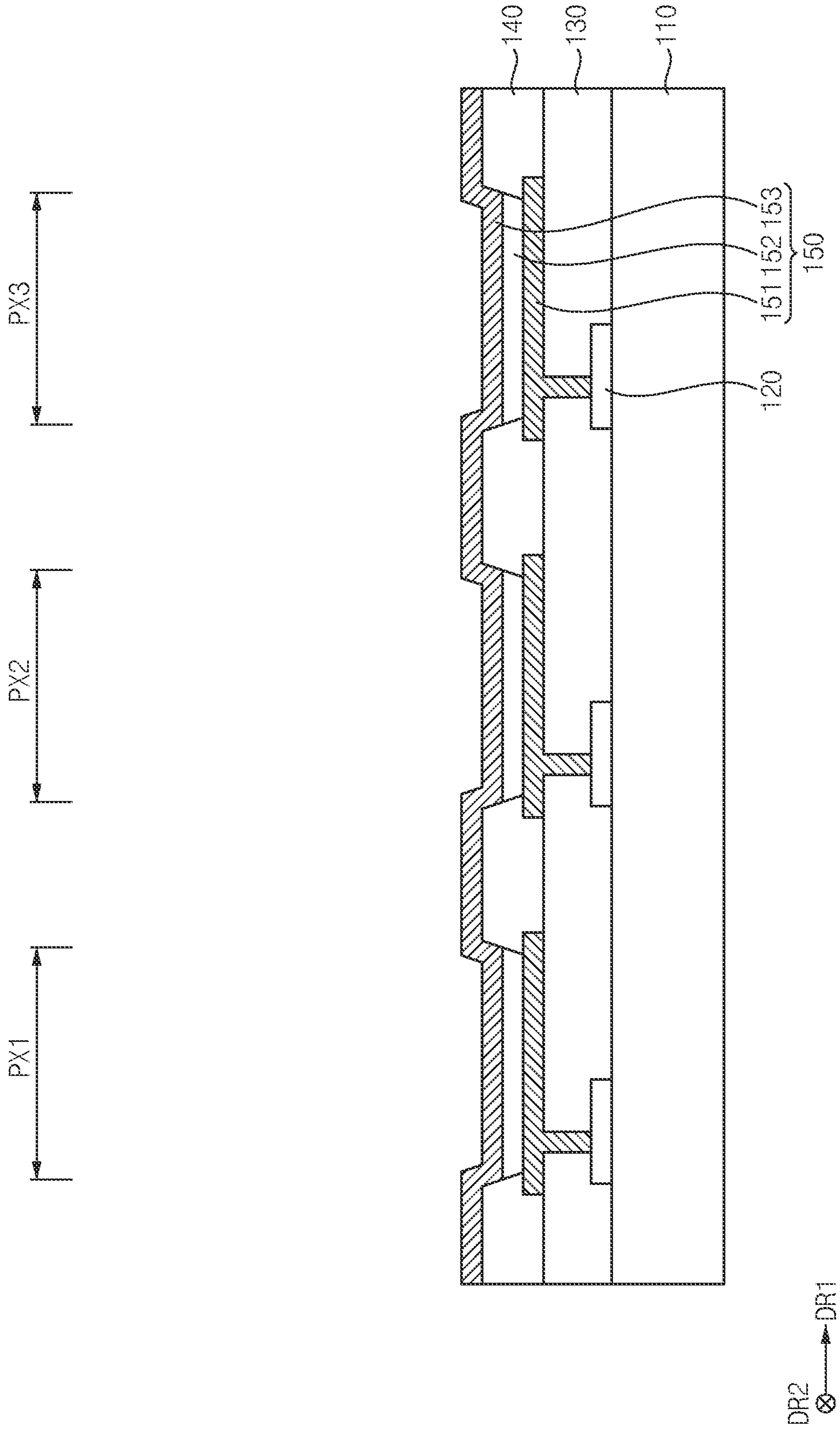
FIGS. 7, 8, 9, 10 and 11 are cross-sectional views illustrating a method of manufacturing the display device of FIG. 2.

Referring to FIG. 7, the transistor 120 may be formed on the base substrate 110. The base substrate 110 may include a transparent material or an opaque material. For example, the base substrate 110 may include a transparent resin substrate. For example, the base substrate 110 may include a polymer resin such as, for example, polyether sulfone, polyacrylate, polyether imide, polyethylene naphthalate, polyethylene terephthalate, polyphenylene sulfide, polyarylate, polyimide, polycarbonate, cellulose acetate propionate, or the like. The base substrate 110 including a polymer resin may be flexible, and may be foldable, rollable, and/or bendable. For example, the transistor 120 may be formed using, for example, amorphous silicon (a-Si), crystalline silicon (c-Si), a metal oxide semiconductor, etc.

The insulating structure 130 may be formed on the base substrate 110. The insulating structure 130 may cover the transistor 120. For example, the insulating structure 130 may be formed using at least one inorganic insulating layer and at least one organic insulating layer. For example, the inorganic insulating layer may include, for example, silicon oxide ($SiO_x$), silicon nitride ($SiN_x$), silicon carbide ($SiC_x$), silicon oxynitride ($SiO_xN_y$), silicon oxycarbide ($SiO_xC_y$), etc. In addition, the organic insulating layer may include, for example, a photoresist, a polyacryl-based resin, a polyimide-based resin, a polyamide-based resin, a siloxane-based resin, an acrylic resin, an epoxy-based resin, etc.

The lower electrode 151 may be formed in each of the first, second, and third pixel areas PX1, PX2, and PX3 on the insulating structure 130. The lower electrode 151 may be connected to the transistor 120 through a contact hole formed by removing a portion of the insulating structure 130. For example, the lower electrode 151 may be formed using, for example, a metal, an alloy, a metal nitride, a conductive metal oxide, a transparent conductive material, etc. In an embodiment of the present disclosure, the lower electrode 151 may include a conductive oxide such as, for example, indium tin oxide (ITO), indium zinc oxide (IZO), zinc oxide (ZnO), indium oxide ($InO_x$), indium gallium oxide (IGO), or aluminum zinc oxide (AZO), and/or may include a reflective film including, for example, silver (Ag), magnesium (Mg), aluminum (Al), platinum (Pt), palladium (Pd), gold (Au), nickel (Ni), neodymium (Nd), iridium (Ir), chromium (Cr), or a compound thereof.

The pixel defining layer 140 may be formed on the insulating structure 130 and the lower electrode 151. The pixel defining layer 140 may have an opening exposing a portion of the upper surface of the lower electrode 151. The pixel defining layer 140 may be formed using an organic material and/or an inorganic material. In an embodiment of the present disclosure, the pixel defining layer 140 may include an organic material such as, for example, a photoresist, a polyacrylic resin, a polyimide-based resin, a polyamide-based resin, a siloxane-based resin, an acrylic resin, an epoxy-based resin, etc.

The organic light emitting layer 152 may be formed in each of the first, second, and third pixel areas PX1, PX2, and PX3 on the lower electrode 151. For example, the organic light emitting layer 152 may be formed inside the opening of the pixel defining layer 140. For example, the organic light emitting layer 152 may be formed using a low molecular weight organic compound and/or a high molecular weight organic compound. In an embodiment of the present disclosure, the organic light emitting layer 152 may include at least one of materials emitting red, green, or blue light, and may include a fluorescent material or a phosphorescent material.

The upper electrode 153 may be formed on the organic light emitting layer 152 and the pixel defining layer 140. The upper electrode 153 may be entirely formed in the first pixel area PX1, the second pixel area PX2 and the third pixel area PX3. For example, the upper electrode 153 may be formed using, for example, a metal, an alloy, a metal nitride, a conductive metal oxide, a transparent conductive material, etc. In an embodiment of the present disclosure, the upper electrode 153 may include, for example, aluminum (Al), platinum (Pt), silver (Ag), magnesium (Mg), gold (Au), chromium (Cr), tungsten (W), titanium (Ti), and/or the like, and/or may include a transparent conductive oxide (TCO) film such as, for example, an indium tin oxide (ITO) film, an indium zinc oxide (IZO) film, a zinc oxide (ZnO) film, or an indium oxide ($InO_x$) film.

Accordingly, the light emitting element 150 including the lower electrode 151, the organic light emitting layer 152, and the upper electrode 153 may be formed in each of the first to third pixel areas PX1, PX2, and PX3 on the base substrate 110.

Figure 8:
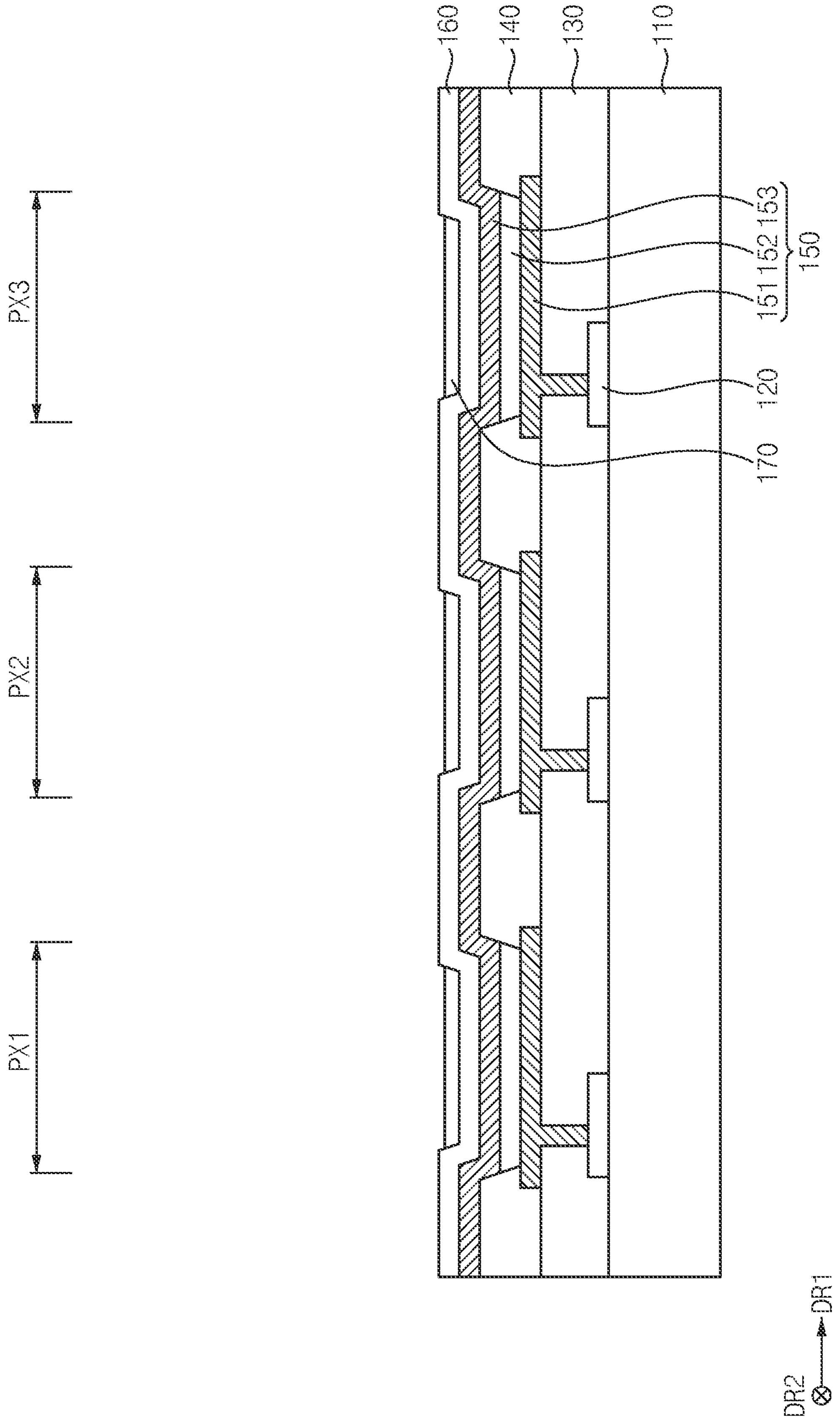

Referring to FIG. 8, the capping layer 160 may be formed on the upper electrode 153. The capping layer 160 may be entirely formed on the upper electrode 153. For example, the capping layer 160 may be formed using an inorganic material and/or an organic material. In an embodiment of the present disclosure, the capping layer 160 may include lithium fluoride (LiF).

The inorganic layer 170 may be formed in each of the first, second, and third pixel areas PX1, PX2, and PX3 on the capping layer 160. Alternatively, the inorganic layer 170 may be formed to continuously extend on the capping layer 160. In an embodiment of the present disclosure, the inorganic layer 170 may be formed using a metal and a metal oxide layer. For example, the metal may include ytterbium (Yb), bismuth (Bi), tin (Sn), zinc (Zn), indium (In), etc. These may be used alone or in combination with each other. For example, the metal oxide layer may include molybdenum dioxide ($MoO_2$), molybdenum trioxide ($MoO_3$), tungsten trioxide ($WO_3$), indium tin oxide (ITO), zinc oxide (ZnO), etc. These may be used alone or in combination with each other.

Figure 9:
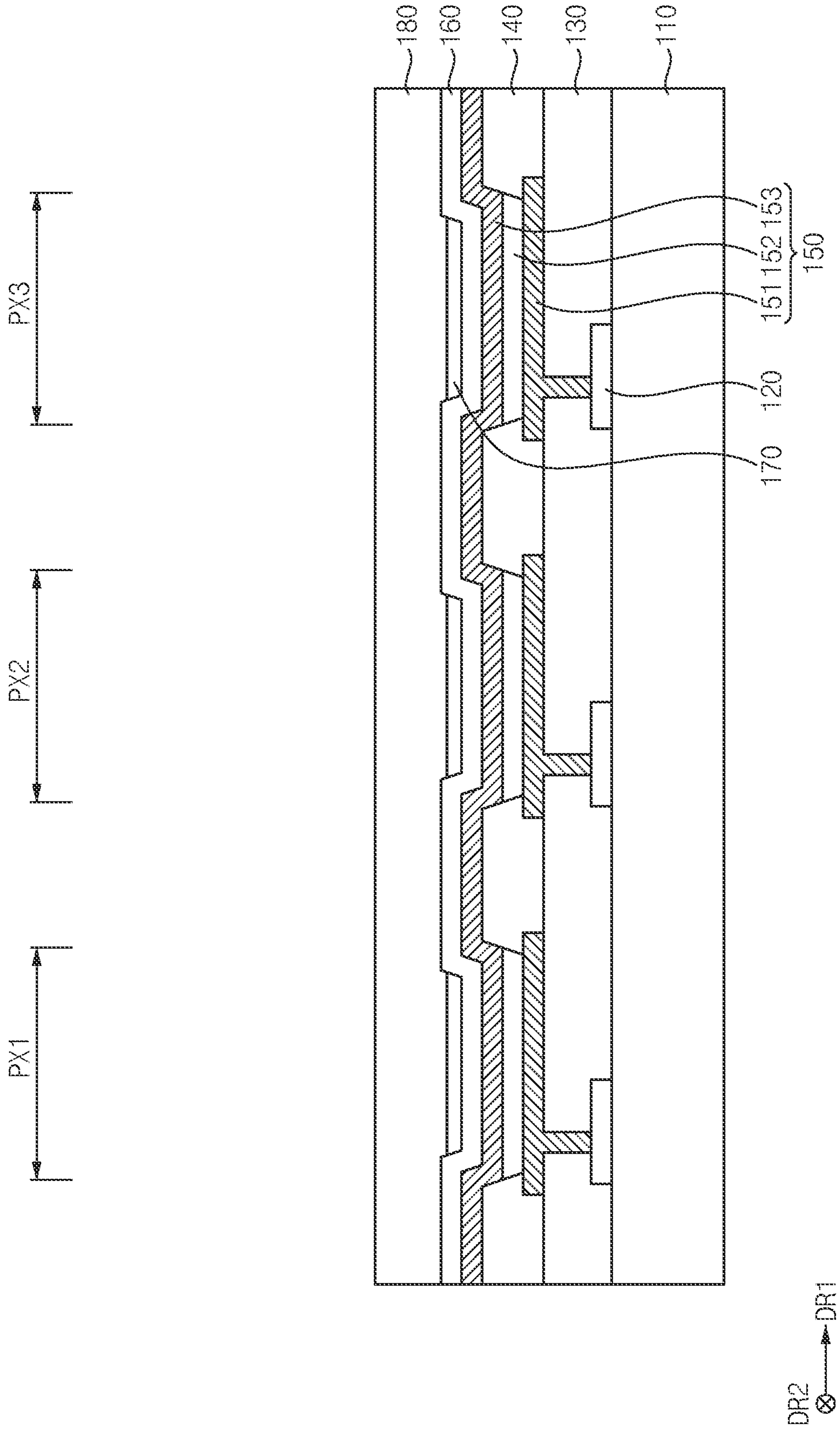

Referring to FIG. 9, the encapsulation layer 180 may be formed on the capping layer 160 and the inorganic layer 170. The encapsulation layer 180 may be entirely formed in the first pixel area PX1, the second pixel area PX2 and the third pixel area PX3. For example, the encapsulation layer 180 may be formed using an inorganic material and an organic material. In an embodiment of the present disclosure, the inorganic material of the encapsulation layer 180 may include, for example, silicon oxide ($SiO_x$), silicon nitride ($SiN_x$), silicon oxynitride ($SiO_xN_y$), etc., and the organic material of the encapsulation layer 180 may include a cured polymer such as, for example, polyacrylate.

Figure 10:
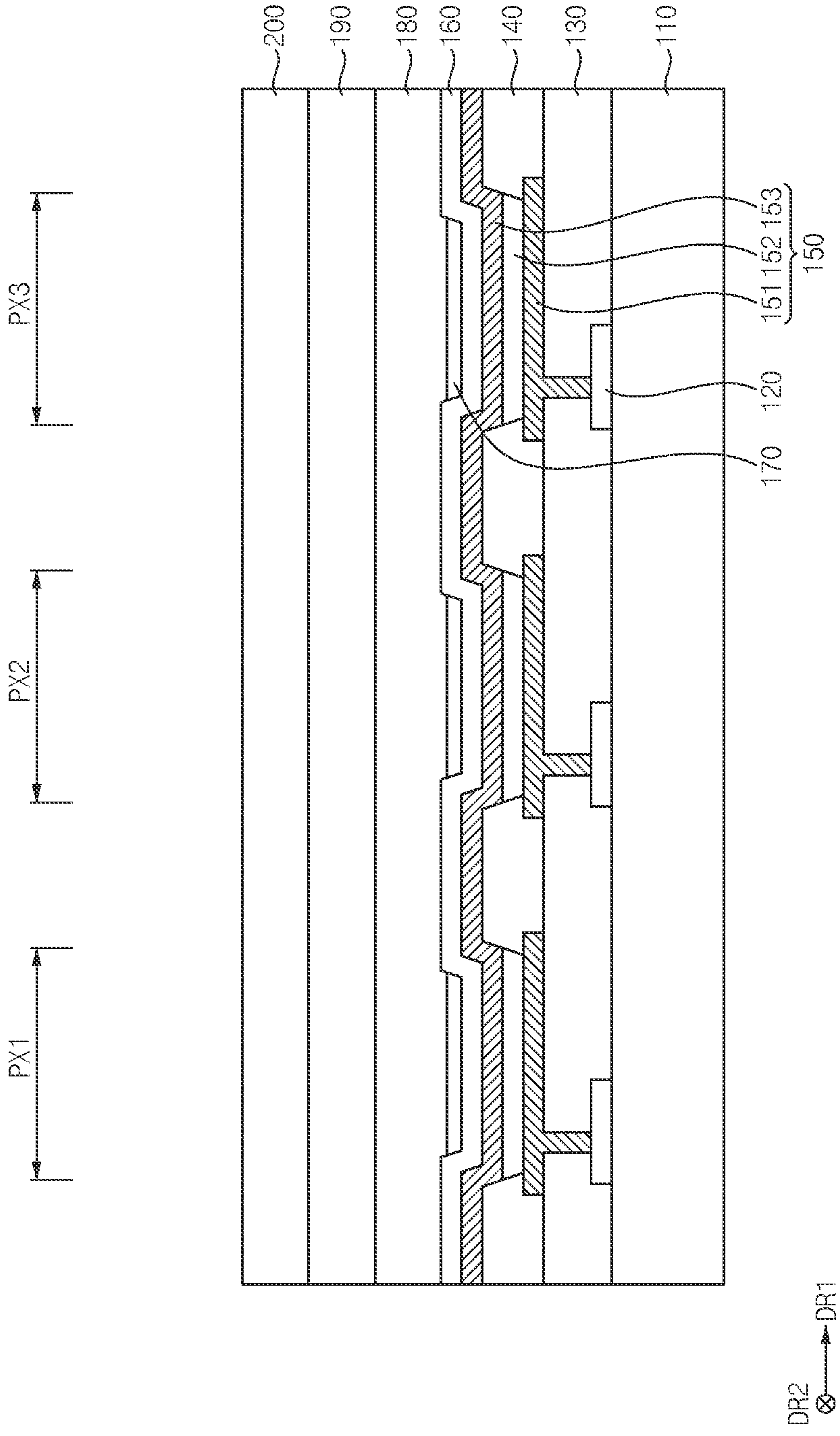

Referring to FIG. 10, the sensing layer 190 may be formed on the encapsulation layer 180. The sensing layer 190 may be entirely formed in the first pixel area PX1, the second pixel area PX2 and the third pixel area PX3. A plurality of sensing electrodes may be formed in the sensing layer 190.

The organic layer 200 may be formed on the sensing layer 190. The organic layer 200 may be entirely formed in the first pixel area PX1, the second pixel area PX2 and the third pixel area PX3. In an embodiment of the present disclosure, the organic layer 200 may be formed using a material having negative dispersion. In an embodiment of the present disclosure, the organic layer 200 may include a quarter-wave plate, and the quarter-wave plate may include, for example, a uniaxially stretched cycloolefin film, a uniaxially stretched polyethylene terephthalate film, a uniaxially stretched polycarbonate film or a liquid crystal film. For example, the organic layer 200 may be formed using the reactive mesogen liquid crystal.

Figure 11:
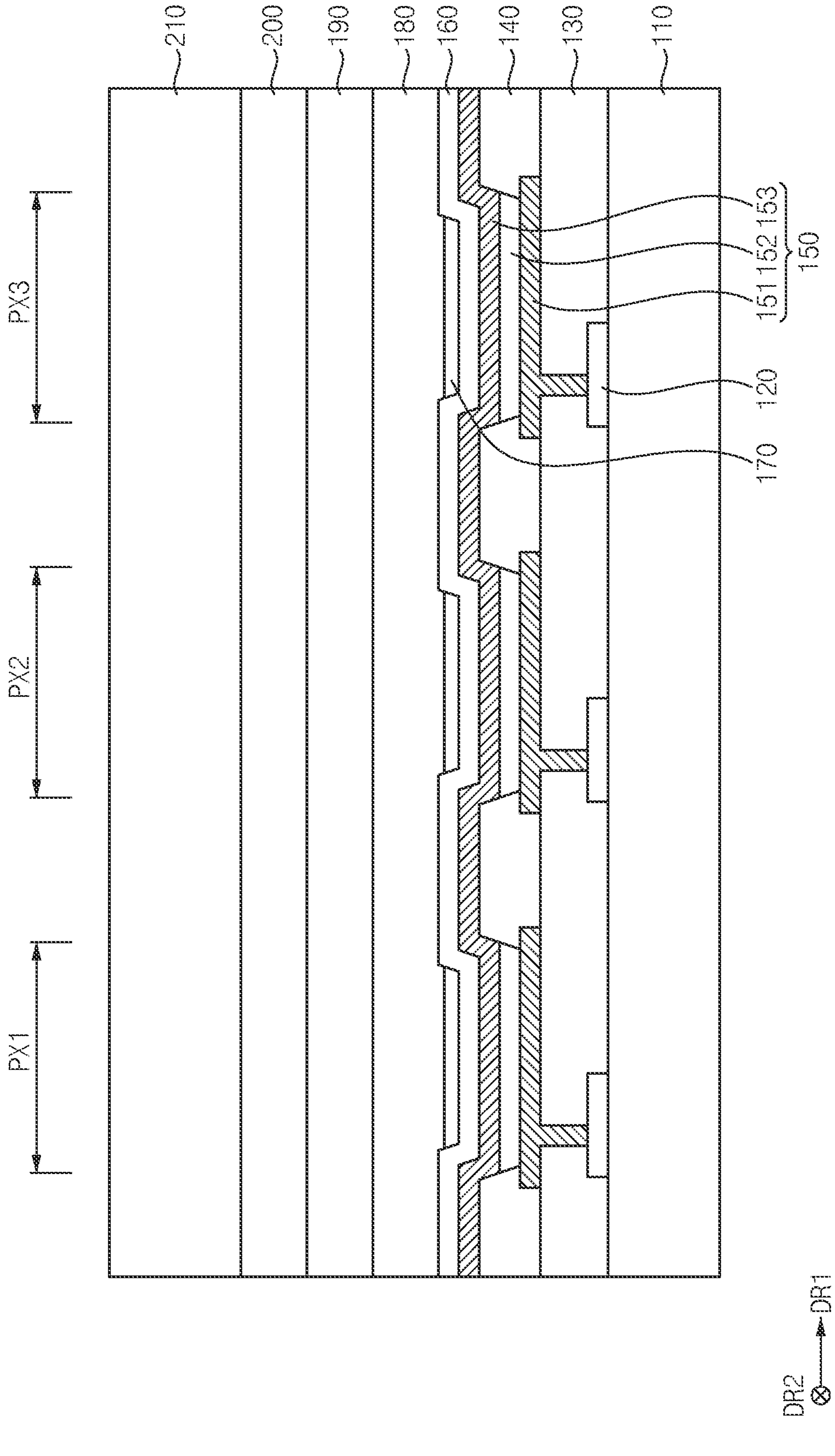

Referring to FIG. 11, the anti-reflection layer 210 may be formed on the organic layer 200. The anti-reflection layer 210 may be entirely formed in the first pixel area PX1, the second pixel area PX2 and the third pixel area PX3. In an embodiment of the present disclosure, the anti-reflection layer 210 may be formed using the reactive mesogen liquid crystal and the dichroic dye.

In an embodiment of the present disclosure, the reactive mesogen liquid crystal of the anti-reflection layer 210 may have the nematic phase, or the smectic A phase. A material having the nematic phase or the smectic A phase may include liquid crystal molecules aligned in a certain direction. The dichroic dye may be aligned along the alignment of the reactive mesogen liquid crystal having the nematic phase or the smectic A phase. Accordingly, the anti-reflection layer 210 may have polarization characteristics by the dichroic dye.

In an embodiment of the present disclosure, the dichroic dye may include the azo group (—N═N—). In an embodiment of the present disclosure, the dichroic dye may include two or more azo groups to form a polyazole dye. The aromatic compounds having the azo group may be used as the dichroic dye. In an embodiment of the present disclosure, the anti-reflection layer 210 may further include a dye having chromophore in addition to the dichroic dye including the azo group.

In an embodiment of the present disclosure, the mass ratio of the mass of the dichroic dye to the total mass of the reactive mesogen liquid crystal in the anti-reflection layer 210 may be about 10% or less. When the mass ratio of the mass of the dichroic dye to the total mass of the reactive mesogen liquid crystal exceeds about 10%, the dichroic dye may not be completely dissolved in the reactive mesogen liquid crystal. Thus, manufacturing the anti-reflection layer 210 may not be easy.

In an embodiment of the present disclosure, the anti-reflection layer 210 may be formed through a process of doping and coating the reactive mesogen liquid crystal with the dichroic dye. In the doping and coating process, the dichroic dye may be aligned along the alignment of the liquid crystal material having a high order parameter. A state in which the dichroic dye is doped into the reactive mesogen liquid crystal may be referred to as a guest-host liquid crystal. The guest-host liquid crystal according to the present disclosure uses a mixture of the dichroic dye as a guest material and the reactive mesogen liquid crystal as a host material in a display device for effecting a display of a colored image. For example, the guest-host liquid crystal may reduce external light reflection, and thus, may enhance the display quality of the display device.

The present disclosure can be applied to various display devices. For example, the present disclosure can be applied to various display devices such as display devices for vehicles, ships and aircraft, portable communication devices, display devices for exhibition or information transmission, medical display devices and the like.

The foregoing is illustrative of the embodiments of the present disclosure, and is not to be construed as limiting thereof. Although a few embodiments have been described with reference to the figures, those skilled in the art will readily appreciate that many variations and modifications may be made therein without departing from the spirit and scope of the present disclosure as defined in the appended claims.

What is claimed is:

1. A display device comprising:

a base substrate;

a light emitting element disposed on the base substrate;

an inorganic layer disposed on the light emitting element and comprising a metal and a metal oxide layer;

an encapsulation layer disposed on the inorganic layer;

an organic layer disposed on the encapsulation layer and comprising a quarter-wave plate; and an anti-reflection layer disposed on the organic layer.

2. The display device of claim 1, wherein the organic layer comprises a material having negative dispersion.

3. The display device of claim 2, wherein the material having negative dispersion comprises a reactive mesogen liquid crystal.

4. The display device of claim 1, wherein the metal comprises at least one selected from a group including ytterbium (Yb), bismuth (Bi), tin (Sn), zinc (Zn) and indium (In).

5. The display device of claim 1, wherein the metal oxide layer comprises at least one selected from a group including molybdenum dioxide ($MoO_2$), molybdenum trioxide ($MoO_3$), tungsten trioxide ($WO_3$), indium tin oxide (ITO) and zinc oxide (ZnO).

6. The display device of claim 1, wherein the anti-reflection layer comprises a reactive mesogen liquid crystal and a dichroic dye.

7. The display device of claim 6, wherein the reactive mesogen liquid crystal has a nematic phase.

8. The display device of claim 6, wherein the reactive mesogen liquid crystal has a smectic A phase.

9. The display device of claim 6, wherein the dichroic dye comprises an azo group.

10. The display device of claim 9, wherein a mass ratio of a mass of the dichroic dye to a total mass of the reactive mesogen liquid crystal is about 10% or less.

* * * * *